United States Patent [19]

Place

[11] Patent Number: 4,951,051
[45] Date of Patent: Aug. 21, 1990

[54] OVERLOAD DETECTOR FOR AN ANALOG-TO-DIGITAL CONVERTER

[75] Inventor: Harry Place, Ridgewood, N.J.
[73] Assignee: ITT Corporation, New York, N.Y.
[21] Appl. No.: 401,357
[22] Filed: Aug. 31, 1989
[51] Int. Cl.⁵ .................. H03M 1/06; H03M 1/10
[52] U.S. Cl. .................................. 341/118; 341/120; 341/155; 455/217
[58] Field of Search ............... 341/118, 120, 155, 161; 455/217, 67, 226

[56] References Cited

U.S. PATENT DOCUMENTS

| | | | |
|---|---|---|---|
| 4,302,812 | 11/1981 | Fitch | 341/899 |
| 4,384,278 | 5/1983 | Benjamin | 341/118 |
| 4,550,425 | 10/1985 | Anderson et al. | 341/138 |
| 4,562,456 | 12/1985 | Bolger | 341/118 |
| 4,602,374 | 7/1986 | Nakamura et al. | 341/118 |
| 4,679,028 | 7/1987 | Wilson et al. | 341/120 |
| 4,805,192 | 2/1989 | Confalonieri et al. | 341/118 |

Primary Examiner—William M. Shoop, Jr.
Assistant Examiner—Gary J. Romano
Attorney, Agent, or Firm—Thomas N. Twomey

[57] ABSTRACT

An overload detector for an analog-to-digital converter. A series of logic gates are connected to the output of an analog-to-digital converter for determining the presence of an upper limit and a lower limit of an overload condition. A signal indicative of such a condition is input to circuitry which extends the length of the signal so that it is visible or audible to a user. An algorithm for a computer causes a latch to be engaged when an overload condition occurs. The latch is coupled to a pulse stretching circuit which permits a visible or audible signal to be generated.

16 Claims, 4 Drawing Sheets

OVERLOAD DETECTOR FOR AN ANALOG-TO-DIGITAL CONVERTER

BACKGROUND OF THE INVENTION

The present invention relates to an analog-to-digital converter and more particularly to an overload detector for such converter.

Digitization of analog signals, including audio, telephone and television, is accomplished by analog to digital (A/D) converters. Because the signal is digitized, the upper and lower excursion that is possible is rigidly defined. The binary scale is used to represent the digital signal magnitude in linear form. The upper limit of the scale is defined to be 255, while the lower limit is 0. In an 8-bit digital system the upper limit is represented by all logic 1's (hexadecimal code FF) and the i lower limit by all logic 0's (hexadecimal code OO).

When the digital signal component is all logic 1's or all logic 0's, the absolute limit is reached. Any additional signal impressed upon the A/D converter is ignored by the circuitry and results in severe distortion of the signal waveform. This in turn often leads to unexpected and undesirable side effects in the overall system performance.

One approach which is used for avoiding distortion of the signal waveform is a conventional level meter. However, when a level meter is used in a system in which speech from a standard desk telephone is impressed on an analog-to-digital converter, the level meter does not indicate voice peaks, many of which are beyond the limits of the A/D converter.

It is therefore an object of the present invention to provide a detector which will effectively indicate overload conditions in an analog-to-digital converter using hardware logic circuitry.

It is another object of the present invention to provide a detector which will indicate overload conditions in a digital signal by using computer software.

It is an additional object of the invention to provide means to visibly or audibly indicate to the user of an analog-to-digital converter system that an input signal is too high or too low.

SUMMARY OF THE INVENTION

These objects and others which will become apparent hereinafter are accomplished by the present invention which provides a detector for indicating an overload condition of a digital signal including first gate means for receiving the signal and producing a first output signal when the digital signal reaches a first predetermined logic state, the first logic state indicating a lower limit for the digital signal. There is also includes second gate means for receiving the digital signal and producing a second output signal when the digital signal reaches a second logic state which indicates an upper limit for the digital signal. A third gate means is coupled to the first and second gate means for producing a third output signal when either one of the first or second output signals is received at the third gate means. The detector also includes means for extending the third output signal which is sent to an indicator so that a discernible signal is produced.

The above-mentioned and other features and objects of this invention will become more apparent by reference to the following description taken in conjunction with the accompanying drawing in which:

FIG. 1. shows an overload detector circuitry for an analog-to-digital converter provided by the present invention;

DESCRIPTION OF THE PREFERRED EMBODIMENT

Figure 1:
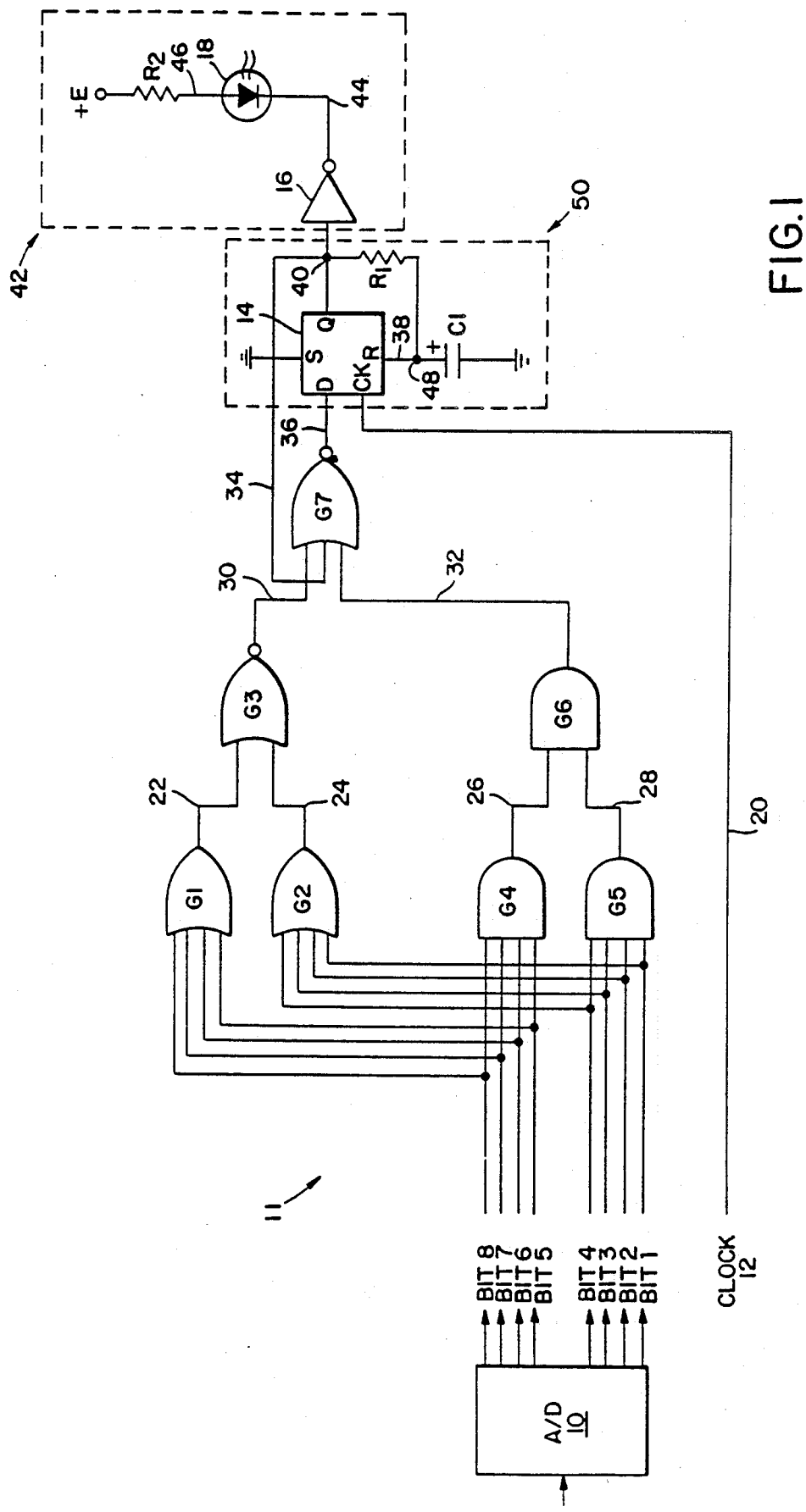

Reference will now be made to FIG. 1 which is a schematic type block diagram of the overload detector of the invention including a visual overload indicator.

An analog-to-digital (A/D) converter 10 receives analog signals, such as voice signals from a standard telephone, and converts the analog signals to digital form in known manner. All of the output leads from the A/D converter 10 enter the overload detector circuit indicated generally as 11. Eight leads, identified as Bits 1 through 8, are illustrated, although a higher or lower number of output leads may be used. Each bit represents an element of a hexadecimal code which corresponds to one segment of an analog signal being input to the A/D converter 10.

A system clock 12 is generated externally to the detector circuit and is input to a "D" type flip-flop 14. The input from the system clock 12 enables the detector circuit to "read" only valid data that arrives via Bits 1 through 8.

The A/D output along Bit 1, Bit 2, Bit 3 and Bit 4 is coupled simultaneously to AND gate G5 and to OR gate G2. In like manner, the A/D output along Bit 5, Bit 6, Bit 7 and Bit 8 is simultaneously coupled to AND gate G4 and to OR gate G1.

AND gates G4 and G5 are coupled to AND gate G6 along respective paths 26 and 28. OR gates G1 and G2 are coupled to NOR gate G3 along respective paths 22 and 24. Gate G3 is coupled to OR gate G7 along path 30 and gate G6 is coupled to gate G7 along path 32. Gate G7 is coupled to a time delay or pulse stretching circuit 50 via path 36.

The time delay circuit 50 includes a D-type flip-flop 14, a capacitor C1 and a resistor R1. Path 36 is coupled to the D input of flip-flop 14. One terminal of the capacitor C1 is coupled to ground potential and the other terminal is coupled to an R (reset) input of flip-flop 14 and to a resistor R1 via a node 48. The Q output of flip-flop 14 is coupled via a node 40 to path 34 and reenters gate G7. A set (S) function of the flip-flop 14 is coupled to ground.

In the embodiment described herein, the capacitor C1 has a capacitance of 1 microfarad (1uf) and the resistor R1 has a resistance of 100 kilo ohms (100kō).

Node 40 is joined to indicator circuitry 42 which includes a lamp driver 16 coupled to a lamp indicator 18 on path 44. The lamp indicator 18 is, for example, an LED type indicator which is coupled via resistor R2 having a via path 46. For example, a 330 ohm resistor would typically be used for a 5 volt source.

In the embodiment described herein, an overload detector is used in connection with voice signals from a standard desk telephone. In such a system where the anticipated channel response is 300–3000 Hz, voice signals are sampled 8000 times per second, each signal thus lasting 125 microseconds. An overload condition causes illumination of the lamp indicator which is too short in time to be noticeable to the human eye. By means of the time delay arrangement, the momentary output signal is extended into an impulse of a length, typically at least 100 milliseconds or more, that can be observed as a distinct visible or auditory signal output indicative of an overload condition.

Figure 2:
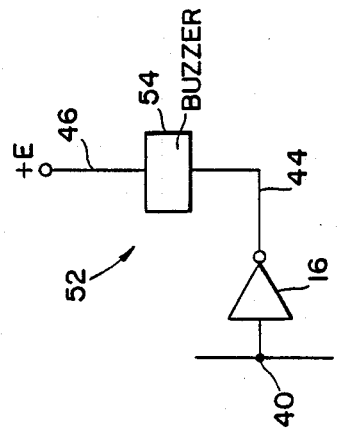
FIG. 2 shows a modification to the overload detector circuitry.

FIG. 2 illustrates an alternate embodiment of the overload detector wherein an audible indicator is used instead of a visual indicator. In this embodiment, the indicator circuitry 42 is replaced by an audible indicator circuitry 52.

The audible indicator circuitry 52 is coupled to the path 44 and replaces the visible indicator circuitry 42. The circuitry 52 includes a buzzer 54 coupled to ground potential +E via path 46.

The operation of the overload detector used in connection with a voice signal will now be described. The voice signal is sampled 8,000 times per second or once every 125 microseconds. The sampled signal, in analog form, is input to the analog-to-digital converter 10 where each input signal is converted to an equivalent eight-bit digital hexadecimal coded signal. As stated above, in the embodiment described herein the code includes eight bits of logic "1s" and logic "0s" which, when taken together, represent the level of the sampled analog voice signal. An output of eight "1s" represents the upper limit of a clear signal and an output of eight "0s" represents the lower limit of a clear signal.

The eight bits (Bit 1 to Bit 8) simultaneously enter OR gates G1, G2 and gates G4, G5. Two AND gates and two OR gates have been shown to reduce the number of leads entering a single gate and thus simplify the circuit. However, any other arrangement may be used.

The output of each of the OR gates G1 and G2 is input to NOR gate G3. Gates G1, G2 and G3 constitute a circuit arrangement such that at any time should all input leads (Bits 1–8) be a logic "0" level, a logic "0" will be output from gates G1 and G2 and appear on paths 22 and 24. The NOR gate G3 will then receive two logic "0s" and will output a logic 1 at path 30.

The output of each of the AND gates G4 and G5 is input to AND gate G6. Gates G4, G5 and G6 constitute a circuit arrangement such that at any time should all input leads (Bits 1–8) equal a logic "1" level, a logic "1" will be output from gates G4 and G5 and appear on paths 26, 28. The AND gate G6 will then receive two logic "1s" and will output a logic "1" at path 32.

Since gate G7 is an OR gate, a logic "1" on either of paths 30, 32 will cause a logic "1" to appear at path 36. A logic "0" will cause a logic "0" to appear at path 36.

All logic "1s" and all logic "0s" on Bits 1–8 represent the upper and lower limits of the overload detector and will cause activation of an overload indicator in the following manner.

During the period that data is valid, the rise of the signal from clock 12 on flip-flop 14 will cause the flip-flop to be set. When the clock signal is applied to flip-flop 14, a logic "1" appearing at the D input of the flip-flop from gate G7 causes a logic "1" to appear at the Q output of the flip-flop. The output signal then reenters the gate G7, thus maintaining a logic "1" voltage at path 36. In this manner, the flip-flop 14 remains in the set condition regardless of the logic condition of paths 30, 32.

A logic "1" appearing at the Q output of flip-flop 14 also passes from node 40 to the lamp driver 16. The lamp driver 16 activates the lamp indicator 18 which is powered by a +5v d.c. source through resistor R2.

The logic "1" voltage from the Q output of flip-flop 14 also charges the capacitor C1 via node 40 and resistor R1. When the capacitor C1 becomes charged sufficiently, it activates the reset R of flip-flop 14. The reset state of the flip-flop 14 will remain until the next overload condition.

When the voice signals are in an acceptable range, the detector circuitry will operate in the following manner. The input leads (Bits 1–8) will be any combination of logic "0" and logic "1" levels, and the circuit arrangement of gates G1, G2 and G3 will cause a logic "0" to appear at path 30. Similarly, the input leads (Bits 1–8) will be any combination of logic "0" and logic "1" levels, and the circuit arrangement of gates G4, G5 and G6 will cause a logic "0" to appear at path 32. Thus, the output from gate G7 will also be a logic "0". During the time that data is valid and the flip-flop 14 is set, entry of a logic "0" into the flip-flop 14 will not produce an output voltage signal.

Figure 3:
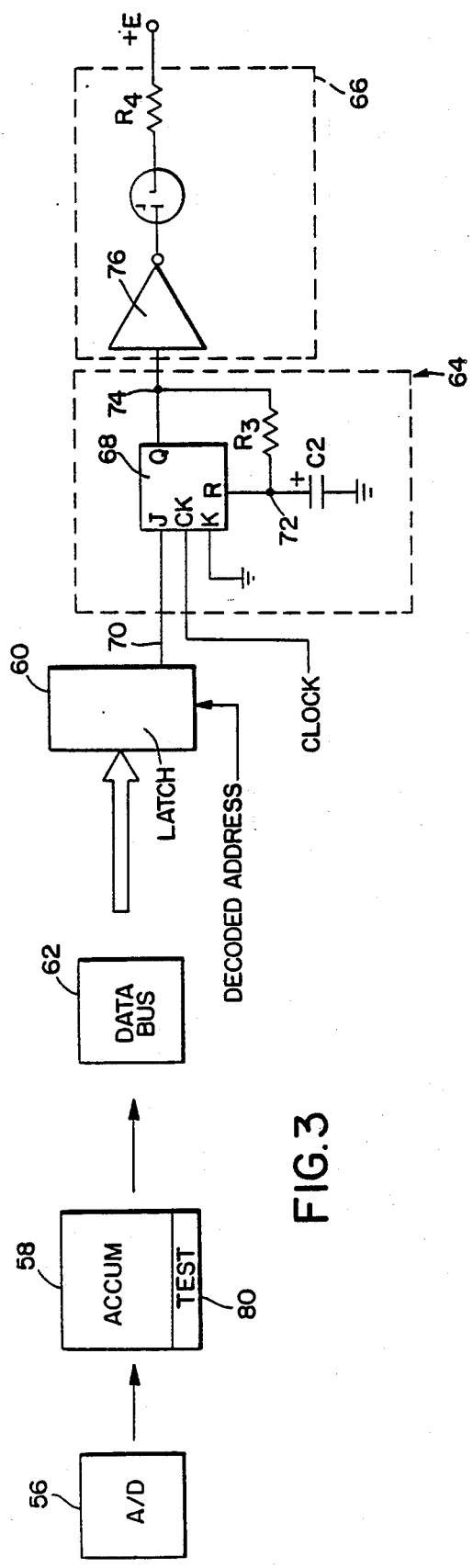
FIG. 3 is a second embodiment of the invention employing a software activated overload detector.

Overload detection according to the present invention can also be accomplished by software. In this connection, reference will be made to FIG. 3 which shows a hardware addition to a microprocessor system which will perform the detection function.

A digital signal from an analog-to-digital converter 56 is entered into a microprocessor by means of a read operation, i.e., the analog-to-digital converter is read as if it were any other data device such as memory or buffer input. The A/D converter 56 has an address and is accessed at a timely recurring rate, which is usually the frame rate of the system.

In the software embodiment described herein, an overload detector is used in connection with voice signals from a standard desk telephone. The frame rate of a telephone line system, having an anticipated channel response of 300–3000 Hz, is 125 microseconds or 8000 times per second. Thus, the A/D converter is read every 125 microseconds, and its contents are transferred to an accumulator 58 in the microprocessor. While the contents of the A/D converter are in the accumulator, a software test of the contents can be made to determine if an overload condition exists.

The result of the software test is passed to an addressable latch 60 via a data bus 62. The output of the latch 60 will be updated based on the test applied to each frame. If an overload condition is present, the output signal sent to an indicator is present for a very short duration of typically 125 microseconds. Because the duration of the signal is short and may not be visible if fed directly to an indicator device, a pulse stretching circuit 64 is employed which is substantially the same as the circuit 50 shown in FIG. 1. The pulse stretching circuit 64 stretches the impulse to a much longer period which will enable an indicator device to be clearly visible or audible to a user operating the telephone system.

The pulse stretching circuit 64 includes a J-K type flip-flop 68, a capacitor C2 and a resistor R2. Path 70 is coupled from latch 60 to the J input of flip-flop 68. One terminal of the capacitor C2 is coupled to ground potential and the other terminal is coupled to an R (reset) input of flip-flop 68 and to one terminal of a resistor R3 via a node 72. The Q output of flip-flop 68 is coupled via a node 74 to the other terminal of resistor R3 and to the indicator circuitry 66. K is coupled to ground. Once the J input goes high, (overload condition) with the presence of a clock pulse (CK), the output Q will remain high until such time as resistor R3 charges capacitor C2 and a reset is accomplished. This occurs approximately 100 milliseconds from the time J went high.

In the embodiment described herein, the capacitor C2 has a capacitance of 1 microfarad (1uf) and the resistor R2 has a resistance of 100 kilo ohms (100 k).

The indicator circuitry 66 is a visual indicator and includes a lamp driver 76 and a lamp indicator 78 which preferably is an LED type indicator. The indicator 78 is coupled via resistor R4 to a d.c. source +E. The circuitry 66 is the same as indicator circuitry 42 of FIG. 1. If an auditory signal is desired, the circuitry 52 of FIG. 2 may be used in place of the circuitry 42.

Figure 4:
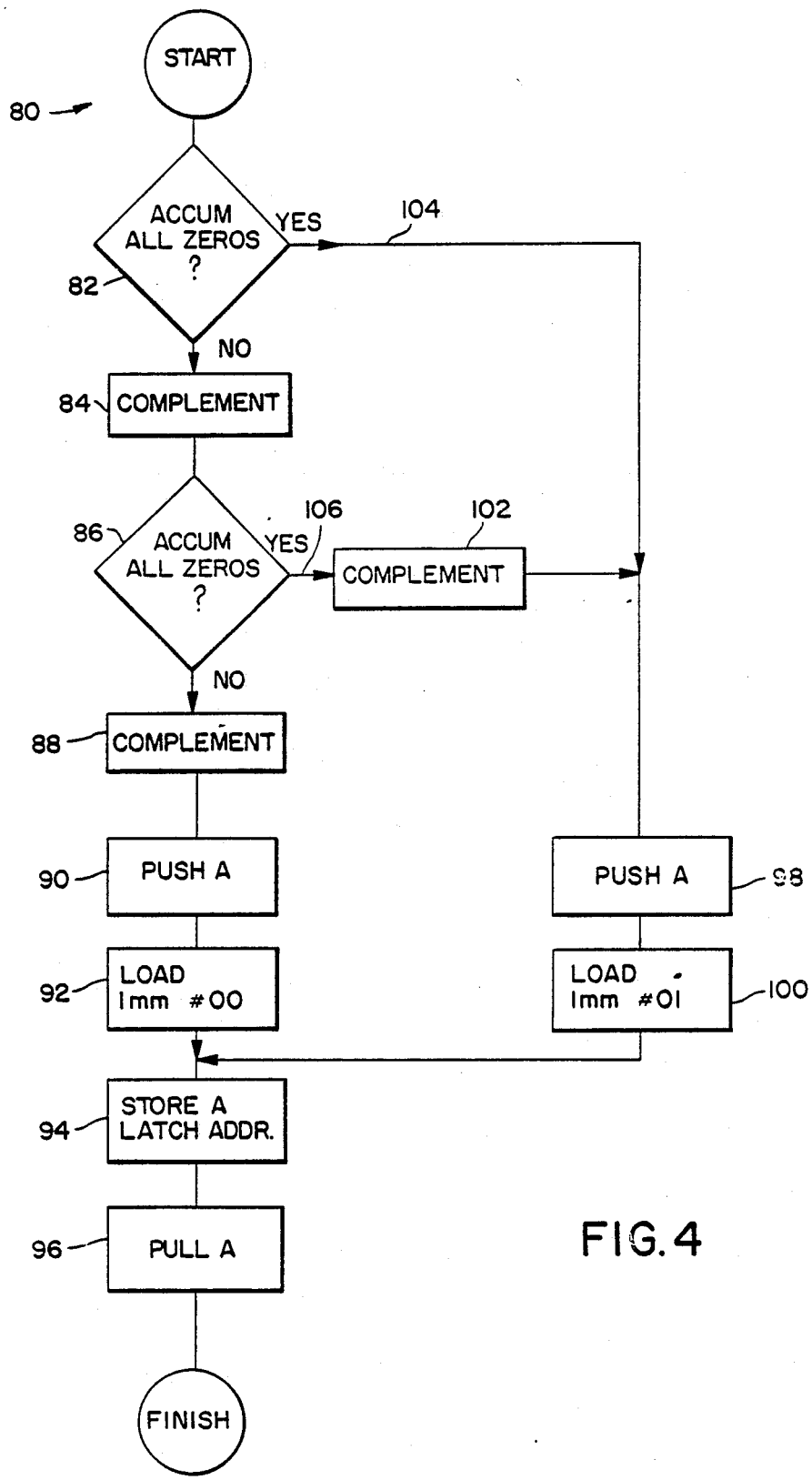
FIG. 4 is a block diagram of the algorithm of the embodiment of FIG. 3.

Reference is now made to FIG. 4 which illustrates the algorithm for the test 80 applied to the contents of the A/D converter 56 which has been read into the accumulator 58. At the start of the program, the accumulator checks the hexadecimal code for the presence of all zeros (ACCUM ALL ZEROS) 82. If the code does not contain all zeros, the complement of the code is entered (COMPLEMENT) 84. Zeroes become ones and ones become zeros. The complement is checked for all zeros (ACCUM ALL ZEROS) 86. In this way, the code is easily tested for the presence of all ones or all zeros which are the upper and lower limits respectively of the voice signal.

If the complement does not contain all zeros, the accumulator contents is again complemented and restored to its original state (COMPLEMENT) 88. The accumulator 58 will then set aside the code (PUSH A) 90 and immediately load a program to reset the latch (LOAD IMM #00) 92 at a given location (STORE A LATCH ADDR.) 94 to indicate a "no-overload" state. The accumulator 58 takes the code from storage (PULL A) 96 and outputs the hexadecimal code in exactly the same form as it entered the accumulator.

If at stage 82 the code contains all zeros, a subroutine 104 is invoked to set the latch and cause the overload indicator 78 to be activated. As shown in FIG. 4, an all zeros indication at stage 82 results in the accumulator setting aside the code (PUSH A) 98 and immediately load a program to set the latch (LOAD IMM #01).

The subroutine ends at this point and joins the main routine at stage 94 which gives the location of the latch (STORE A LATCH ADDR.).

If at stage 82 the code contains all ones, the accumulator is complemented to an all zeros code which will be detected at stage 86 at which point a second subroutine 106 is invoked. The complemented zeros will again be complemented (COMPLEMENT) 102 to restore the code to its original form. The restored code joins and follows subroutine 104 to the main routine to set the latch.

The accumulator contents at the end of the algorithm are exactly the same as the contents that existed at the start of the program.

While I have described above the principles of my invention in connection with specific apparatus, it is to be clearly understood that this description is made only by way of example and not as a limitation to the scope of my invention as set forth in the objects thereof and in the accompanying claims.

What is claimed is:

1. A detector for indicating an overload condition of a digital signal comprising:

first gate means for receiving the digital signal and producing a first output signal when the digital signal reaches a first logic state which is indicative of a predetermined lower limit for the digital signal;

second gate means for receiving the digital signal and producing a second output signal when the digital signal reaches a second logic state which is indicative of a predetermined upper limit for the digital signal;

third gate means coupled to said first and second gate means for producing a third output signal when either one of said first or said second output signals is received at said third gate means;

means coupled to said third gate means for indicating the presence of said third output signal; and means coupled between said indicating means and said third gate means for extending the duration of said third output signal such that said indicating means is a discernible signal.

2. The detector of claim 1 further comprising an analog-to-digital converter joined to said first and second gate means for providing a digital signal.

3. The detector of claim 1 wherein said extending means extends said third output signal into an impulse having a length of at least approximately 100 milliseconds.

4. The detector of claim 1 wherein said extending means includes a flip-flop, a capacitor and a resistor.

5. The detector of claim 1 wherein said extending means includes a monostable multi-vibrator, a capacitor and a resistor.

6. The detector of claim 2 wherein said first gate means includes a first OR gate coupled to said analog-to-digital converter.

7. The detector of claim 6 wherein said second gate means includes a first AND gate coupled to said analog-to-digital converter.

8. The detector of claim 7 wherein said third gate means includes a NOR gate coupled to said first OR gate, a second AND gate coupled to said first AND gate, and a second OR gate coupled to said NOR gate and said second AND gate.

9. The detector of claim 3 wherein said indicating means includes a luminous indicator and an indicator driving amplifier.

10. The detector of claim 3 wherein said indicating means includes a buzzer.

11. The detector of claim 8 wherein said lower limit is all digital zeros emanating from the analog-to-digital converter.

12. The detector of claim 8 wherein said upper limit is all digital ones emanating from the analog-to-digital converter.

13. A method of determining an overload condition in a digital signal comprising the steps performed by a computer producing a first output signal in response to a determination of the presence of a lower limit in a digital signal;

producing a second output signal in response to a determination of the presence of an upper limit in a digital signal;

activating a latch to produce a third output signal in response to either one of said first or second output signals;

increasing the duration of said third output signal;

activating a discernible indicator in response to the increased third output signal; and restoring the latch to a reset condition.

14. The detector of claim 13 wherein said increasing step includes activating a flip-flop which receives the third output signal.

15. The detector of claim 14 wherein the restoring step includes:
   charging a capacitor through a resistor which is coupled to the output of the flip-flop, and
   activating a reset in the flip-flop by the charged capacitor.

16. A method of determining an overload condition in a digital signal comprising the steps performed by a computer
   examining the digital signal for the presence of an overload condition;
   complementing the digital signal upon an indication of the absence of an overload condition;
   reexamining the complemented digital signal for the presence of an overload condition;
   restoring the complemented signal to its original state upon an indication of the absence of an overload condition;
   maintaining the set condition of an indicator circuitry;
   storing the digital signal upon an indication of the presence of an overload condition following said examining and reexamining step; and
   activating an indicator.

* * * * *